(12) United States Patent
Kim

(10) Patent No.: US 7,369,837 B2
(45) Date of Patent: May 6, 2008

(54) FREQUENCY-MIXING METHOD AND FREQUENCY-MIXING DEVICE USING THE SAME

(75) Inventor: Young-Jin Kim, Yongin-si (KR)

(73) Assignee: Samsung Electronics, Co., Ltd., Suwon-Si (KR)

(*) Notice: Subject to any disclaimer, the term of this patent is extended or adjusted under 35 U.S.C. 154(b) by 454 days.

(21) Appl. No.: 11/198,800

(22) Filed: Aug. 5, 2005

(65) Prior Publication Data
US 2006/0039505 A1    Feb. 23, 2006

(30) Foreign Application Priority Data
Aug. 17, 2004    (KR) ...................... 10-2004-0064653

(51) Int. Cl.
*H04B 1/26*    (2006.01)
(52) U.S. Cl. ................... 455/322; 455/323; 455/189.1; 455/209; 455/293; 455/326; 330/127
(58) Field of Classification Search ................ 455/322, 455/323, 189.1, 209, 293, 326; 330/127
See application file for complete search history.

(56) References Cited

U.S. PATENT DOCUMENTS 6,369,651 B1 *   4/2002   Dent .......................... 330/127
6,370,372 B1     4/2002   Molnar et al. ............... 455/323
6,380,927 B1 *   4/2002   Ostrum et al. .............. 345/165
6,587,678 B1     7/2003   Molnar et al. ............... 455/323
6,970,020 B1 *   11/2005  Mei et al. ........................ 327/3

FOREIGN PATENT DOCUMENTS

JP    2001-230631    8/2001
JP    2002-076976    3/2002

* cited by examiner

*Primary Examiner*—Sanh D. Phu
(74) *Attorney, Agent, or Firm*—F. Chau & Associates, LLC.

(57) ABSTRACT

A frequency-mixing method includes a step of generating a first quadrature signal having a predetermined frequency, a second quadrature signal having a phase difference of about 180 degrees with respect to a phase of the first quadrature signal, a third quadrature signal having a phase difference of about 90 degrees with respect to the phase of the first quadrature signal and a fourth quadrature signal having a phase difference of about 90 degrees with respect to a phase of the second quadrature signal; a step of controlling a phase of the third quadrature signal and a phase of the fourth quadrature signal so as to control a linearity of a frequency mixer; and a step of down-converting a radio frequency (RF) signal using the first through the fourth quadrature signals. Accordingly, performance of a direct-conversion receiver (DCR) can be improved by employing a frequency-mixing device capable of enhancing a linearity of a frequency mixer.

12 Claims, 5 Drawing Sheets

FREQUENCY-MIXING METHOD AND FREQUENCY-MIXING DEVICE USING THE SAME

CROSS-REFERENCE TO RELATED APPLICATION

This application claims priority to Korean Patent Application No. 2004-64653, filed on Aug. 17, 2004, the content of which is hereby incorporated by reference in its entirety.

BACKGROUND OF THE INVENTION

1. Field of the Invention

The present invention relates to a frequency-mixing device. More particularly, the present invention relates to a frequency-mixing device and a frequency-mixing method of a direct-conversion receiver (DCR).

2. Description of the Related Art

As known in the art, an intermediate frequency (IF) is a frequency to which a carrier frequency is shifted as an intermediate step in transmission or reception. A zero-IF system directly converts a carrier signal to and from the baseband signal without any IF stages.

The zero-IF receiver-employs a direct-conversion technique, in contrast to that of a superheterodyne receiver which employs a dual-conversion technique. The superheterodyne architecture has been widely employed due to its excellent channel selectivity characteristics.

Because the zero-IF system utilizes one mixer stage to convert the carrier signal directly to and from the baseband without the need for a surface acoustic Wave (SAW) filter, the zero-IF system can save cost, weight, design space, and the system can be implemented on one chip.

There have been various attempts to use the zero-IF technique in a mobile communication system, such as GSM (Global System for Mobile Communication). Mobile communication systems employing the zero-IF technique have become widespread.

In particular, a direct-conversion receiver (hereinafter, referred to as "DCR") adopting the zero-IF technique has the advantages of a simple circuit structure, low cost manufacture and smaller size as compared to those of a superheterodyne receiver. However, in DCRs, the second-order intermodulation distortion (IMD2) is a fundamental problem occurring in a frequency mixer included in the DCR. The IMD2 is due to a non-linearity of the frequency mixer that employs non-linear active elements. When an input signal $e_i$ is applied to a non-linear system, an output signal is generated as represented by Expression 1 below.

$$e_o = \alpha_0 + \alpha_1 e_i + \alpha_2 e_i^2 + \alpha_3 e_i^3 + \quad \text{[Expression 1]}$$

where $\alpha_1$, $\alpha_2$, $\alpha_3$ represent first-, second- and third-order harmonic coefficients, respectively.

The output signal $e_o$ can be represented as a sum of sine waves. Various frequency signals are mixed with one another and then new frequency signals are generated according to Expression 1 in the non-linear system, which is an important characteristic of the non-linear system.

When input signal $e_i$ including two frequency components f1 and f2 or an input signal $e_i$ having two-tone are/is applied to a general non-linear circuit, other frequency components such as 2*f1, 2*f2, f1-f2, f1+f2, 3*f1, 3*f2, 2*f1-f2, 2*f2-f1, 2*f1+f2, 2*f2+f1 and so on, as well as the input frequency components f1 and f2, are generated due to a non-linearity of the non-linear circuit.

Typically, the other frequency components generated due to the non-linearity are removed by a filter. However, when the input frequency components f1 and f2 are similar or identical to each other, and a target frequency signal among output frequency signals belongs to the baseband frequency signal, the frequency component f1-f2 close to the baseband frequency signal are hardly removed by the filter. These frequency component signals interfere with one another between channels having a small frequency difference, or distortion effects occur as signals within a particular frequency band interfere with one another.

The frequency component, resulting from a second-order component (or a second power term) such as the f1-f2 component and f1+f2 component, is the so-called IMD2 (second-order intermodulation distortion) component.

In a system such as the DCR, the f1-f2 component is included in a pass band filter for filtering a target frequency signal.

A relationship between a degree of the IMD2 and an amplified degree of an input frequency can represent a linearity of a circuit of the DCR system. The degree of the linearity of the circuit of the DCR system is represented by an IP2 (second-order intercept point).

A power of the initial IMD2 signal increases to a power level of an output IMD2 signal faster than a power of the input frequency signal increases to a power level of a target output frequency signal. Consequently, at first, the power level of the initial IMD2 signal is less than the power level of the output frequency signal; however, ultimately, the power level of the initial IMD2 signal becomes equal to the power level of the target output frequency signal. The power point at which the power level of the IMD2 signal is identical with the power level of the target output frequency signal is called the IP2 (second-order intercept point).

The larger the IP2 is, the better the linearity is, because a high power level of the input frequency signal is required in order that the power level of the initial IMD2 signal is equal to the power level of the target output frequency signal. A receiver second-order intercept point (IIP2), which represents an IP2 in view of an input, is a parameter for zero-IF applications. An output second-order intercept point (OIP2), which represents an IP2 in view of an output, is another parameter for zero-IF applications.

Because the DCR shifts the target frequency signal to the baseband, the IMD2 signal that is generated by the frequency mixer and which is located in the baseband can degrade the performance of the DCR. Therefore, the DCR requires a frequency-mixing device or a frequency mixer having a high IP2 value (or a low IMD2).

FIG. 1 is a circuit diagram illustrating a conventional Gilbert cell mixer. The Gilbert cell mixer is a kind of a balanced active mixer (typically, the balanced active mixer has a differential output characteristic). Referring to FIG. 1, the Gilbert cell mixer includes an emitter coupled transistor pair Q1 and Q2 for inputting a radio frequency signal pair RF+ and RF−, degeneration resistors RE1 and RE2, Gilbert cell core transistors Q3, Q4, Q5 and Q6, pull-up resistors R1 and R2, and differential output nodes N01 and N02.

When an identical second-order harmonic component is generated at each of the differential output nodes N01 and N02, the second order harmonic components of both differential output nodes N01 and N02 are counterbalanced with each other by a common-mode removal characteristic. As a result, the second-order harmonic components can be removed.

However, the second-order harmonic components are not completely removed, because the differential output nodes N01 and N02 generate the second-order harmonic components that have mismatches in phases and amplitude of the second-order harmonic components. The phase and amplitude mismatches are caused by: a mismatch between the emitter coupled transistor pair Q1 and Q2, a mismatch between the degeneration resistors RE1 and RE2, a duty ratio characteristic of a local oscillator LO, a mismatch between the pull-up resistors R1 and R2, and a mismatch between input radio frequency signals RF+ and RF−. Unfortunately, it is impossible to match the differential characteristic perfectly by removing all of above-mentioned mismatches.

FIG. 2 is a circuit diagram illustrating a conventional sub-harmonic mixer. Operations of the sub-harmonic mixer shown in FIG. 2 are disclosed in U.S. Pat. No. 6,587,678.

According to U.S. Pat. No. 6,587,678, the sub-harmonic mixer shown in FIG. 2 can perform a direct conversion using first through fourth quadrature signals. The first through fourth quadrature signals have a phase difference of about 90 degrees with respect to each other and have a local oscillator frequency corresponding to a half radio frequency (RF) signal. In FIG. 2, the reference symbols L00, L090, L0180 and L0270 represent signals corresponding to the first and the fourth quadrature signals, respectively, processed by a pre-processor according to a method disclosed in U.S. Pat. No. 6,587,678.

According to a method disclosed in U.S. Pat. No. 6,587,678, the direct conversion also can be performed using the local oscillator LO that generates an oscillating frequency lower than the frequency of the radio frequency (RF) signal. However, in U.S. Pat. No. 6,587,678, performance degradation due to the IMD2 was not solved.

SUMMARY OF THE INVENTION

Exemplary embodiments of the present invention provide a frequency mixing method capable of enhancing a linearity of a frequency mixer.

Exemplary embodiments of the present invention also provide a frequency-mixing device capable of enhancing a linearity of a frequency mixer.

Exemplary embodiments of the present invention also provide a direct-conversion receiver (DCR) including the frequency-mixing device capable of enhancing a linearity of a frequency mixer.

In various exemplary embodiments of the present invention, a frequency-mixing method includes: generating a first quadrature signal having a predetermined frequency, a second quadrature signal having a phase difference of about 180 degrees with respect to a phase of the first quadrature signal, a third quadrature signal having a phase difference of about 90 degrees with respect to the phase of the first quadrature signal, and a fourth quadrature signal having a phase difference of about 90 degrees with respect to a phase of the second quadrature signal; controlling a phase of the third quadrature signal and a phase of the fourth quadrature signal so as to control a linearity of a frequency mixer; and down-converting a radio frequency (RF) signal using the first through the fourth quadrature signals.

In various exemplary embodiments of the present invention, a frequency-mixing device includes: a quadrature signal generator configured to generate a first quadrature signal having a predetermined frequency, a second quadrature signal having a phase difference of about 180 degrees with respect to a phase of the first quadrature signal, a third quadrature signal having a phase delay of about 90 degrees with respect to the phase of the first quadrature signal and a fourth quadrature signal having a phase delay of about 90 degrees with respect to a phase of the second quadrature signal; a phase controller configured to control a phase of the third quadrature signal and a phase of the fourth quadrature signal; and a sub-harmonic mixer configured to down-convert a radio frequency (RF) signal using the first through the fourth quadrature signals.

In various exemplary embodiments of the present invention, a direct-conversion receiver (DCR) includes: a frequency-mixing device including a quadrature signal generator configured to generate a first quadrature signal having a predetermined frequency, a second quadrature signal having a phase difference of about 180 degrees with respect to a phase of the first quadrature signal, a third quadrature signal having a phase delay of about 90 degrees with respect to the phase of the first quadrature signal and a fourth quadrature signal having a phase delay of about 90 degrees with respect to a phase of the second quadrature signal; a phase controller configured to control a phase of the third quadrature signal and a phase of the fourth quadrature signal; and a sub-harmonic mixer configured to down-convert a radio frequency (RF) signal using the first through the fourth quadrature signals.

BRIEF DESCRIPTION OF THE DRAWINGS

The present invention will become more apparent to those of ordinary skill in the art by describing, in detail, exemplary embodiments thereof with reference to the accompanying drawings, of which.

DETAILED DESCRIPTION OF EXEMPLARY EMBODIMENTS

Figure 1:
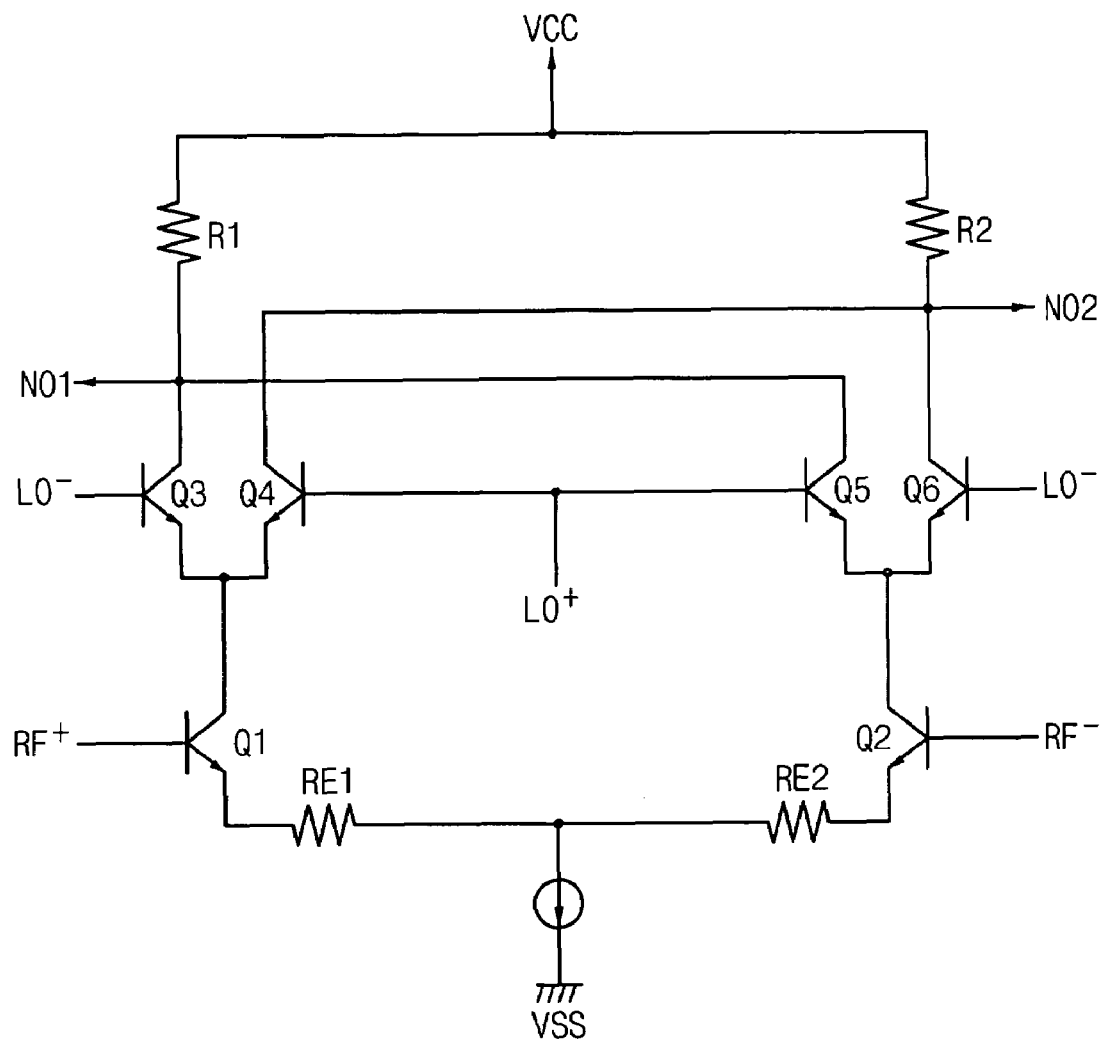
FIG. 1 is a circuit diagram illustrating a conventional Gilbert cell mixer.

Hereinafter, the present invention will be described in detail with reference to the accompanying drawings. However, specific structural and functional details disclosed herein are merely representative for purposes of describing exemplary embodiments of the present invention. The present invention can be embodied in numerous alternate forms and should not be construed as limited to the exemplary embodiments set forth herein. It should be understood that the intention is to cover all modifications, equivalents, and alternatives falling within the spirit and scope of the invention. Like reference numerals refer to like elements throughout the description of the figures.

It will be understood that, although the terms first, second, etc. are used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing exemplary embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
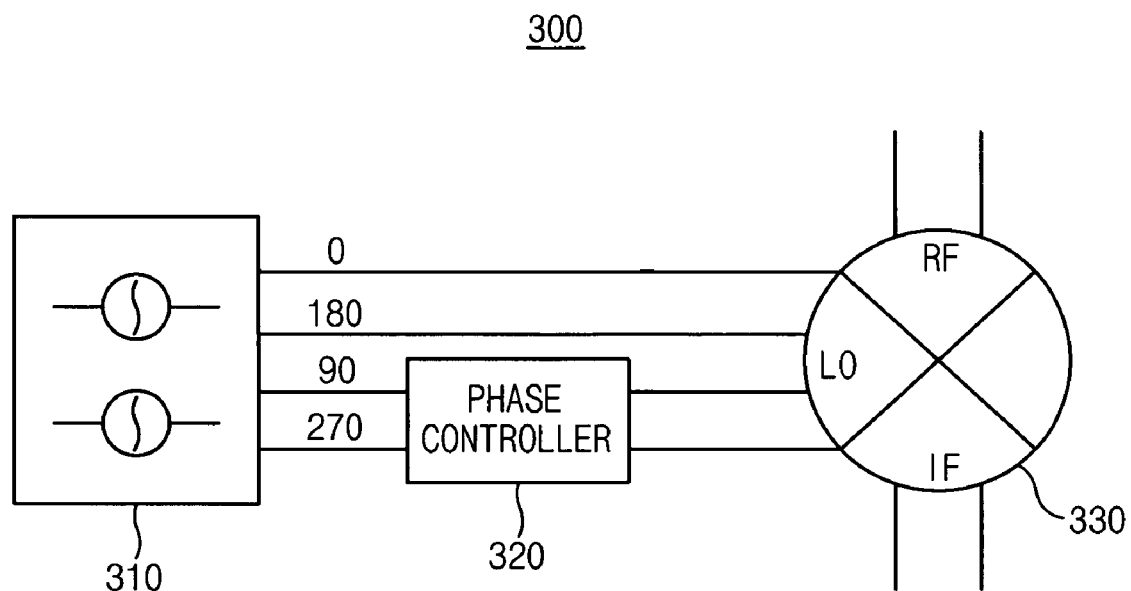
FIG. 3 is a block diagram illustrating a frequency-mixing device according to an exemplary embodiment of the present invention.

FIG. 3 is a block diagram illustrating a frequency-mixing device according to an exemplary embodiment of the present invention. Referring to FIG. 3, the frequency-mixing device 300 includes a quadrature signal generator 310, a phase controller 320 and a sub-harmonic mixer 330.

The quadrature signal generator 310 generates a first quadrature signal, a second quadrature signal having a phase difference of about 180 degrees with respect to a phase of the first quadrature signal, a third quadrature signal having a phase difference of about 90 degrees with respect to the phase of the first quadrature signal and a fourth quadrature signal having a phase difference of about 90 degrees with respect to a phase of the second quadrature signal. There may be various possible methods of generating the four quadrature signals having a phase difference of about 90 degrees with respect to each other, which will be apparent to one of ordinary skill in the art.

The phase controller 320 controls the phases of the third and the fourth quadrature signals received from the quadrature signal generator 310. The phase controller 320 can be implemented using, for example, a phase shifter, a phase trim, or a phase delay and so on. Alternatively, the quadrature signal generator 310 can include the phase controller 320. The sub-harmonic mixer 330 performs a mixing operation using a quadrature phase signal having a half frequency of a target LO frequency. In the exemplary embodiments of the present invention, the sub-harmonic mixer shown in FIG. 3 employs the sub-harmonic mixer shown in FIG. 2; however, the sub-harmonic mixer 330 is not limited to the sub-harmonic mixer shown in FIG. 2.

When the phase controller 320 shown in FIG. 3 controls the phases of the third and the fourth quadrature signals, the IP2 of the frequency-mixing device shown in FIG. 3 is calibrated, for the reasons discussed hereinafter. When the phase controller 320 controls the phases of the third and the fourth quadrature signals, in the sub-harmonic mixer 330, phases of switching signals, which applied to bases of the transistors Q3 through Q10 of FIG. 2 that switch the currents I+ and I− in response to the LO signals, are increased. The currents I+ and I− are generated by the RF signals RF+ and RF−.

As a result, a duty ratio (or duty cycle) of the switching signals that switch the currents I+ and I− generated by the RF signal is changed. The change of the duty ratio of the switching signals is the same as the change of a duty cycle of the LO signals LO+ and LO− of the Gilbert cell mixer shown in FIG. 1.

When the duty cycle of the switching signals that switch the currents I_ and I− is changed, the IP2 is changed as represented by Expression 2 below. Expression 2 corresponds to the sub-harmonic mixer model shown in FIG. 2.

Figure 2:
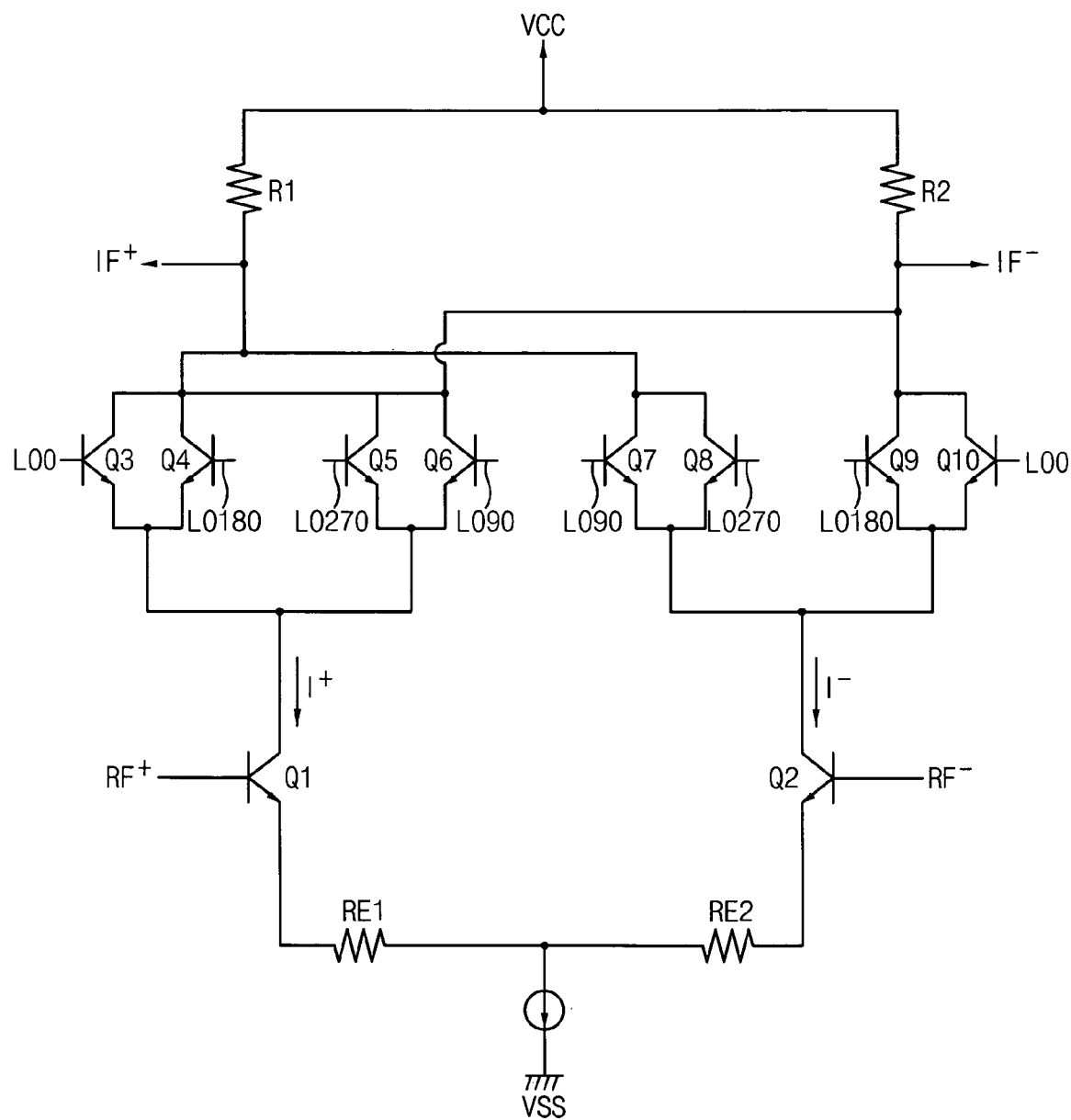
FIG. 2 is a circuit diagram illustrating a conventional sub harmonic mixer.

In Expression 2, $\alpha_2$ denotes a second order harmonic coefficient, $\Delta A_{RF}$ denotes a magnitude mismatch between the differential pair RF signals RF+ and RF−, $\Delta\eta$ denotes a mismatch (when the switching signal have a duty ratio of about 50%) between the switching signals which are applied to bases of the transistors Q3 through Q10 of FIG. 2 that switch the currents I_ and I−, $\Delta g_m$ denotes a transconductance mismatch between the transistor pair Q1 and Q2 where the RF signal is applied, $\Delta R$ denotes a mismatch between the pull-up resistor pair R1 and R2, and $\eta_{norm}$ is about 0.5.

$$IIP2 = \frac{\frac{8\sqrt{2}}{\pi}}{\alpha_2 \left[ \Delta\eta(2\Delta A_{RF} + \Delta g_m) + \frac{\Delta R}{2}\eta_{norm} \right]}$$

Referring to Expression 2, the denominator of Expression 2 can be ideally equal to zero by controlling $\Delta\eta$, which means that the IIP2 becomes infinity (that is, the IMD2 can not be generated).

Expression 2 can utilize an ideal model. In practice, it is difficult to allow the IIP2 to have an infinity value, however, the IIP2 can be controlled by adjusting phases of the switching signals, which are applied to bases of the transistors Q3 through Q10 of FIG. 2 that switch the currents I+ and I−, and then by adjusting the duty ratio of the switching signals, so that a maximum IIP2 point can be found and the IP2 can be compensated.

Figure 4:
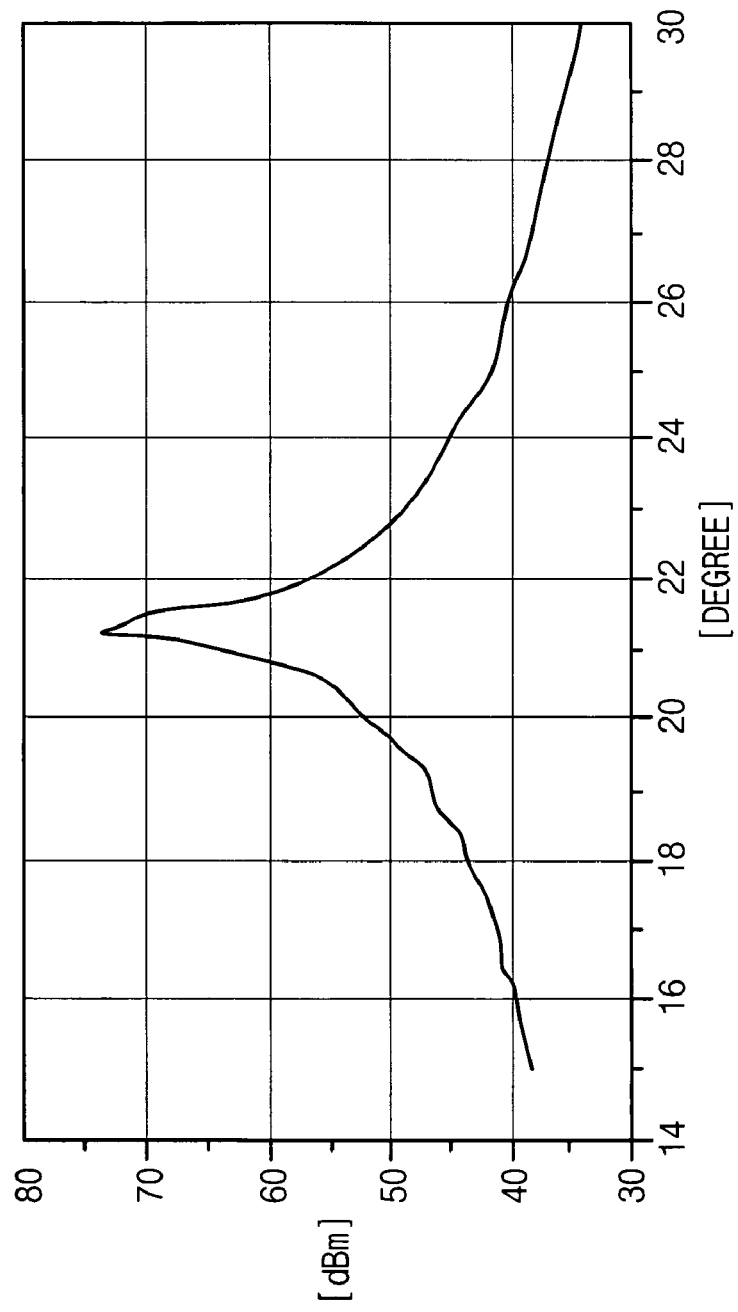
FIG. 4 is a simulation waveform illustrating the IP2 variation of the frequency-mixing device shown in FIG. 3.

FIG. 4 is a simulation waveform illustrating IP2 variation of the frequency-mixing device shown in FIG. 3. In FIG. 4, a simulated frequency-mixing device employs the sub-harmonic mixer shown in FIG. 2, and FIG. 4 shows a result simulated under condition of 50% mismatch between the pull-up resistors R1 and R2. Referring to FIG. 4, the IIP2 is changed by controlling the phases of the third and the fourth quadrature signals in the frequency-mixing device shown in FIG. 3.

The x-axis represents phase delays (degree) added to the third quadrature signal having a phase delay of about 90 degrees with respect to the phase of the first quadrature signal, and added to the fourth quadrature signal having a phase delay of about 90 degrees with respect to the phase of the second quadrature signal.

The y-axis represents a magnitude (dBm) of the IIP2. As shown in FIG. 4, the IIP2 has the maximum point of about 74 dBm according as the phases of the third and the fourth quadrature signals are controlled with the additional phase delay of about 21 degrees. In such case, the phase delays of the third and the fourth quadrature signals are about 111 degrees with respect to the phases of the first and the second quadrature signals, respectively. Accordingly, the relationship shown in FIG. 4 can be applied to set the frequency-mixing device so that the IP2 can be increased.

Further, when the IP2 of the frequency-mixing device is increased, the IP2 of the DCR employing the frequency-mixing device is also increased since the frequency-mixing device included in the DCR mainly affects a generation of the IMD2 components.

Figure 5:
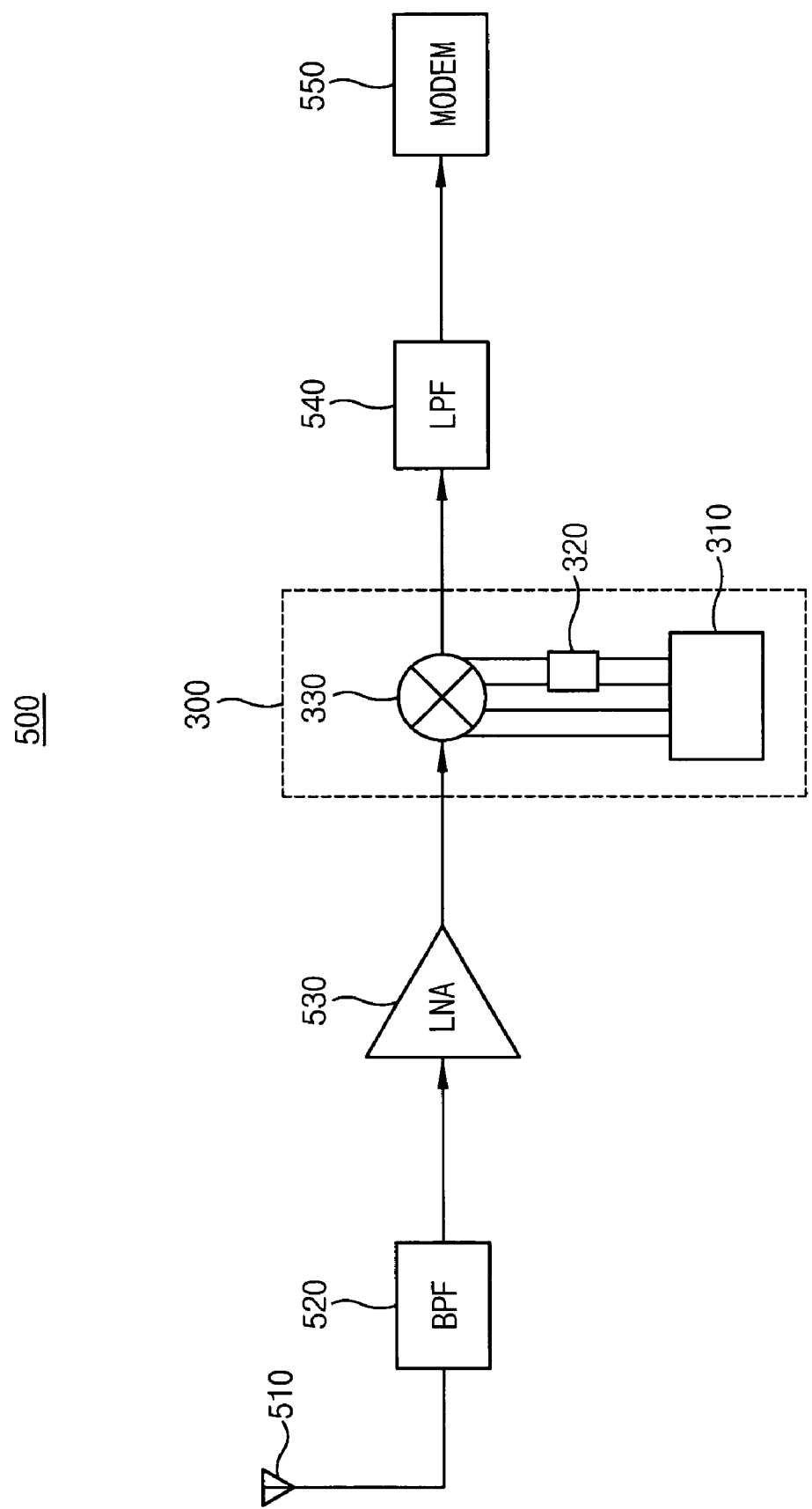
FIG. 5 is a block diagram illustrating a direct-conversion receiver (DCR) including the frequency-mixing device shown in FIG. 3 according to an exemplary embodiment of the present invention.

FIG. 5 is a block diagram illustrating a direct-conversion receiver (DCR) including the frequency-mixing device shown in FIG. 3 according to an exemplary embodiment of the present invention. Referring to FIG. 5, the DCR includes an antenna 510, a band pass filter (BPF) 520, a low noise amplifier (LNA) 530, a quadrature signal generator 310, a phase controller 320, a sub-harmonic mixer 330, a low pass filter (LPF) 540 and a modem 550. The quadrature signal generator 310, the phase controller 320 and the sub-harmonic mixer 330 shown in FIG. 5 have an identical function and are designated by the same reference symbols as those shown in FIG. 3, respectively.

When a radio frequency (RF) signal is inputted to the BPF 520 through the antenna 510, the BPF 520 filters only signals having a needed frequency band. The signals filtered from the BPF 520 are down-converted to the baseband signals by the frequency-mixing device 300. The frequency-mixing device 300 of FIG. 5 is identical with the frequency-mixing device 300 of FIG. 3, and includes the quadrature signal generator 310, the phase controller 320 and the sub-harmonic mixer 330.

The DCR 500 shown in FIG. 5 can calibrate the linearity of the frequency-mixing device 300 by controlling the phases of the third and the fourth quadrature signals generated from the quadrature signal generator 310. Description of the operation of the frequency-mixing device 300 of FIG. 5 is omitted since the operations of the frequency-mixing device 300 are described above with reference to FIG. 3

The down-converted signals are filtered by the LPF 540, the signals filtered from the LPF 540 are provided to the modem 550 and then are modulated/demodulated by the modem 550.

In the exemplary embodiments of the present invention, primarily calibration of the IP2 is discussed; however, the linearity calibration according to the present invention can include the other linearity calibration methods realized by controlling phases of the quadrature signals of the frequency mixer. It will be understood, therefore, that the linearity calibration according to the present invention is not limited to the calibration of the IP2. Additionally, the present invention is not limited to the DCR system, but rather can be applicable to all of the various RF systems that perform a mixing operation using the quadrature phase signals.

The frequency-mixing method and the frequency-mixing device according to the exemplary embodiments of the present invention can increase the linearity of the frequency-mixing device and can decrease the IMD2 of the frequency-mixing device and the RF receiver employing the frequency-mixing device 300. Therefore, the direct-conversion type RF system according to various exemplary embodiments of the present invention can effectively detect a target frequency signal. Furthermore, because the frequency-mixing method controls the phases of the quadrature signals, a cost-effective RF system according to various exemplary embodiments of the present invention can be implemented, the IP2 can be calibrated and the linearity can be increased.

While the exemplary embodiments of the present invention have been described in detail for the purpose of illustration, the inventive processes and apparatus are not to be construed as limited thereby. It will be readily apparent to those of reasonable skill in the art that various modifications to the foregoing exemplary embodiments can be made without departing from the spirit and scope of the invention as defined by the appended claims.

What is claimed is:

1. A frequency-mixing method comprising:
generating a first quadrature signal having a predetermined frequency, a second quadrature signal having a phase difference of about 180 degrees with respect to a phase of the first quadrature signal, a third quadrature signal having a phase difference of about 90 degrees with respect to the phase of the first quadrature signal and a fourth quadrature signal having a phase difference of about 90 degrees with respect to a phase of the second quadrature signal;
controlling a phase of the third quadrature signal and a phase of the fourth quadrature signal so as to control a linearity of a frequency mixer; and
down-converting a radio frequency (RF) signal using the first through the fourth quadrature signals.

2. The method of claim 1, wherein the frequency-mixing method is used for a direct-conversion receiver (DCR).

3. The method of claim 2, wherein the linearity is controlled by controlling an IP2 (second-order intercept point) of the direct-conversion receiver (DCR).

4. The method of claim 3, wherein the IP2 (second-order intercept point) of the direct-conversion receiver (DCR) is varied according as the phase of the third quadrature signal and the phase of the fourth quadrature signal are adjusted when the radio frequency (RF) signal is down-converted using the first through fourth quadrature signals.

5. A frequency-mixing method comprising:
generating a first quadrature signal having a predetermined frequency and a second quadrature signal having a phase difference of about 180 degrees with respect to a phase of the first quadrature signal;
generating a third quadrature signal having a first phase delay that is changeable based on a phase delay of about 90 degrees with respect to the phase of the first quadrature signal, and a fourth quadrature signal having a second phase delay that is changeable based on a phase delay of about 90 degrees with respect to a phase of the second quadrature signal;
changing a phase of the third quadrature signal and a phase of the fourth quadrature signal with additional phase delays of predetermined degrees so as to control a linearity of a frequency mixer; and
down-converting a radio frequency (RF) signal using the first through the fourth quadrature signals.

6. The method of claim 5, wherein the frequency-mixing method is used for a direct-conversion receiver (DCR).

7. The method of claim 6, wherein the linearity is controlled by controlling an IP2 (second-order intercept point) of the direct-conversion receiver (DCR).

8. A frequency-mixing device comprising:
a quadrature signal generator configured to generate a first quadrature signal having a predetermined frequency, a second quadrature signal having a phase difference of about 180 degrees with respect to a phase of the first quadrature signal, a third quadrature signal having a phase delay of about 90 degrees with respect to the phase of the first quadrature signal and a fourth quadrature signal having a phase delay of about 90 degrees with respect to a phase of the second quadrature signal;

a phase controller configured to control a phase of the third quadrature signal and a phase of the fourth quadrature signal; and a sub-harmonic mixer configured to down-convert a radio frequency (RF) signal using the first through the fourth quadrature signals.

9. The frequency-mixing device of claim 8, wherein the frequency-mixing device adjust an IP2 (second-order intercept point) of the frequency-mixing device by adjusting the phases of the third quadrature signal and the fourth quadrature signal.

10. The frequency-mixing device of claim 9, wherein the frequency-mixing device is used for a direct-conversion receiver (DCR).

11. A direct-conversion receiver (DCR) comprising the frequency-mixing device of claim 8.

12. A direct-conversion receiver (DCR) comprising the frequency-mixing device of claim 9.

* * * * *